United States Patent
Wu

(10) Patent No.: US 9,627,813 B1
(45) Date of Patent: Apr. 18, 2017

(54) CARD CONNECTOR WITH IDENTIFICATION FUNCTION

(71) Applicant: TAI-SOL ELECTRONICS CO., LTD., Taipei (TW)

(72) Inventor: Chin-Hua Wu, Taipei (TW)

(73) Assignee: TAI-SOL ELECTRONICS CO., LTD., Taipei (TW)

( * ) Notice: Subject to any disclaimer, the term of this patent is extended or adjusted under 35 U.S.C. 154(b) by 0 days.

(21) Appl. No.: 15/241,501

(22) Filed: Aug. 19, 2016

(30) Foreign Application Priority Data

Jul. 15, 2016 (TW) .............................. 105210669 U

(51) Int. Cl.
*H01R 29/00* (2006.01)
*H01R 13/642* (2006.01)
*H01R 12/72* (2011.01)

(52) U.S. Cl.
CPC ......... *H01R 13/642* (2013.01); *H01R 12/721* (2013.01)

(58) Field of Classification Search
CPC ......... H01R 13/7031–13/7034; G06K 7/0073; G06K 7/0021
USPC ........................................ 439/188, 489, 630
See application file for complete search history.

(56) References Cited

U.S. PATENT DOCUMENTS

| | | | | |
|---|---|---|---|---|
| 5,773,901 A * | 6/1998 | Kantner | ................. | H01R 27/00 307/112 |
| 6,130,387 A * | 10/2000 | Bricaud | ............... | G06K 7/0021 200/43.04 |
| 6,547,601 B2 * | 4/2003 | Oguchi | ................. | G06K 13/08 439/630 |
| 6,719,577 B2 * | 4/2004 | Nogami | ............... | G06K 7/0021 439/188 |
| 6,957,983 B1 * | 10/2005 | Lai | ..................... | H01R 13/7033 439/488 |
| 7,044,797 B1 * | 5/2006 | Lai | ....................... | H01R 13/631 439/630 |
| 7,300,296 B1 * | 11/2007 | Tanaka | ................. | G06K 7/0021 439/159 |
| 7,896,671 B2 * | 3/2011 | Kim | ..................... | G06K 7/0021 439/188 |

(Continued)

FOREIGN PATENT DOCUMENTS

TW          M267600          6/2005

*Primary Examiner* — Neil Abrams
(74) *Attorney, Agent, or Firm* — Muncy, Geissler, Olds & Lowe, P.C.

(57) ABSTRACT

A card connector includes a base member including a bottom wall, two opposite sidewalls, a first space and a second space defined between the two sidewalls at different elevations and disposed in communication with each other and an identification terminal that has an actuation segment upwardly backwardly extended from the bottom wall, conducting terminals mounted in the base member, and a cover member including a mating conduction terminal that has a falling segment downwardly extended from a top portion of the cover member and a horizontal segment horizontally extended from the distal end of the falling segment and suspended below the distal end of the actuation segment of the identification terminal so that the identification terminal is pressable downward into contact with the mating conduction terminal upon insertion of a predetermined card.

10 Claims, 9 Drawing Sheets

(56) References Cited

U.S. PATENT DOCUMENTS

| | | | | |
|---|---|---|---|---|
| 8,419,478 B2 * | 4/2013 | Liu | ................... | H01R 25/00 439/159 |
| 8,523,614 B2 * | 9/2013 | Matsunaga | .......... | H01R 12/716 439/630 |
| 8,678,861 B2 * | 3/2014 | Little | ................ | G06K 7/0021 439/630 |

* cited by examiner

CARD CONNECTOR WITH IDENTIFICATION FUNCTION

BACKGROUND OF THE INVENTION

1. Field of the Invention

The present invention relates to electronic card connector technology and more particularly, to a card connector capable of identifying the type of the card being inserted therein.

2. Description of the Related Art

The card insertion detection technique used in existing card connectors is to mount two spring leaves at one lateral side of the connector body, keeping the two spring leaves apart from each other at a predetermined distance. When a card is inserted, it squeezes one spring leaf sideway and then touches the other spring leaf to achieve electrical conductivity, and thus, the insertion of a card is detected. Taiwan Patent No. M267,600 discloses a technique of using multiple sets of spring leaves for the detection of the insertion of a variety of different specifications of cards and the setting of anti-write state of the inserted card. Upon insertion of a card, the inserted card forces a contacting terminal to deform and touches a common terminal to achieve electrical conductivity, thereby achieving the effect of card insertion detection or anti-write detection.

The aforesaid prior art technique can achieve the expected effect, however, it is not practical for identifying co-foot-bit memory cards such as SD (Secure Digital) card and MMC (Multi Media Card) card, due to the problem that SD card and MMC card have the same width with different thickness. Therefore, the aforesaid prior art technique of using lateral detection terminals obviously cannot meet the requirements for the identification of such cards like SD card and MMC card that have the same width with different thickness.

SUMMARY OF THE INVENTION

The present invention has been accomplished under the circumstances in view. It is the main object of the present invention to provide a card connector, which is capable of identifying two different cards that have the same width and different thicknesses.

To achieve this and other objects of the present invention, a card connector comprises a base member, a cover member, and a plurality of conducting terminals. The base member comprises a bottom wall, two sidewalls respectively located at two opposite lateral sides of the bottom wall, a first space defined between the two sidewalls, and a second space defined between the two sidewalls and disposed above and in communication with the first space. The cover member comprises a top portion. Further, the cover member is covered the on base member such that the cover member and the base member define a card slot in a front side thereof. Further, the first space and the second space are defined between the cover member and the base member. The conducting terminals are mounted in the base member. The base member further comprises an identification terminal mounted at the bottom wall. The identification terminal comprises an actuation segment upwardly backwardly extended from the bottom wall. Further, the actuation segment projects into the first space; however, it does not enter the second space. The cover member further comprises a mating conduction terminal made from an electrically conductive material and located at the top portion. The mating conduction terminal comprises a falling segment downwardly extended from the top portion, and a horizontal segment extended from a distal end of the falling segment remote from the top portion. The horizontal segment has a distal end thereof suspended below the elevation of the actuation segment of the identification terminal. Further, the identification terminal is pressable downward into contact with the mating conduction terminal upon insertion of a predetermined card into the card slot.

Subject matching between the identification terminal and the mating conduction terminal, the card connector is capable of identifying two different cards that have the same width but different thicknesses.

Other advantages and features of the present invention will be fully understood by reference to the following specification in conjunction with the accompanying drawings, in which like reference signs denote like components of structure.

DETAILED DESCRIPTION OF THE INVENTION

Figure 1:
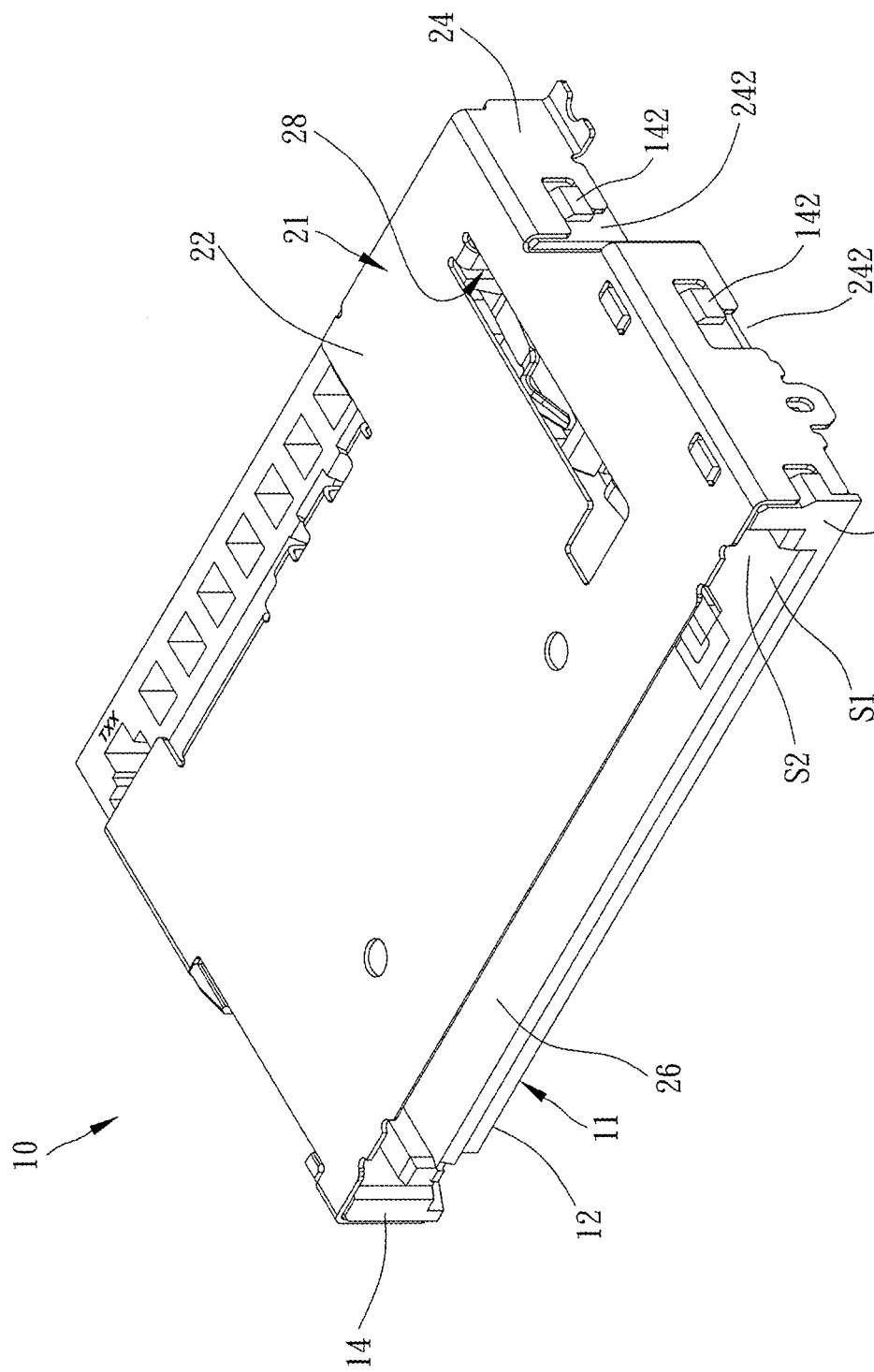
FIG. 1 is an oblique top elevational view of a card connector in accordance with the present invention.
Figure 2:
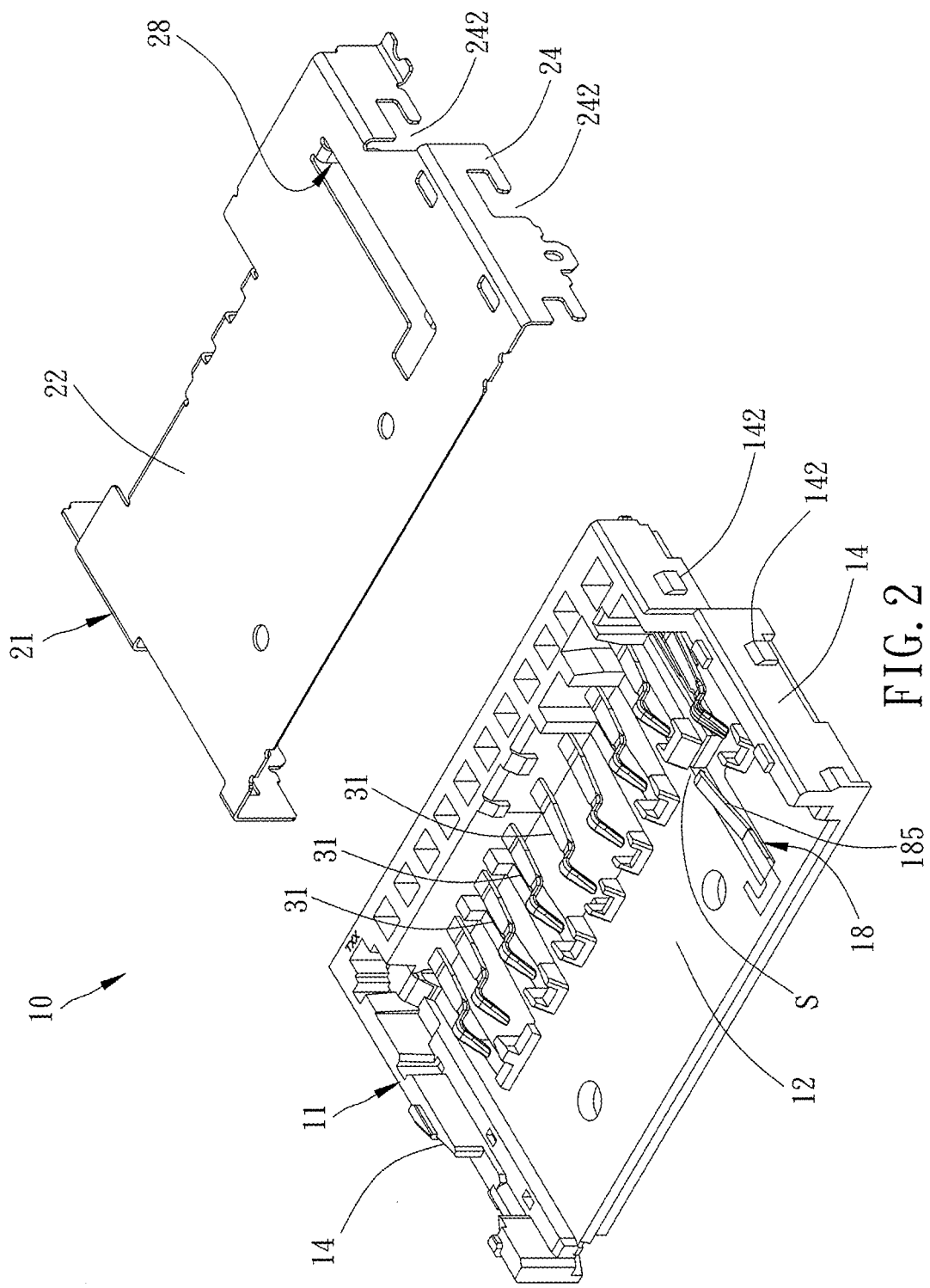
FIG. 2 is an exploded view of the card connector in accordance with the present invention, illustrating the cover member detached from the card connector.
Figure 3:
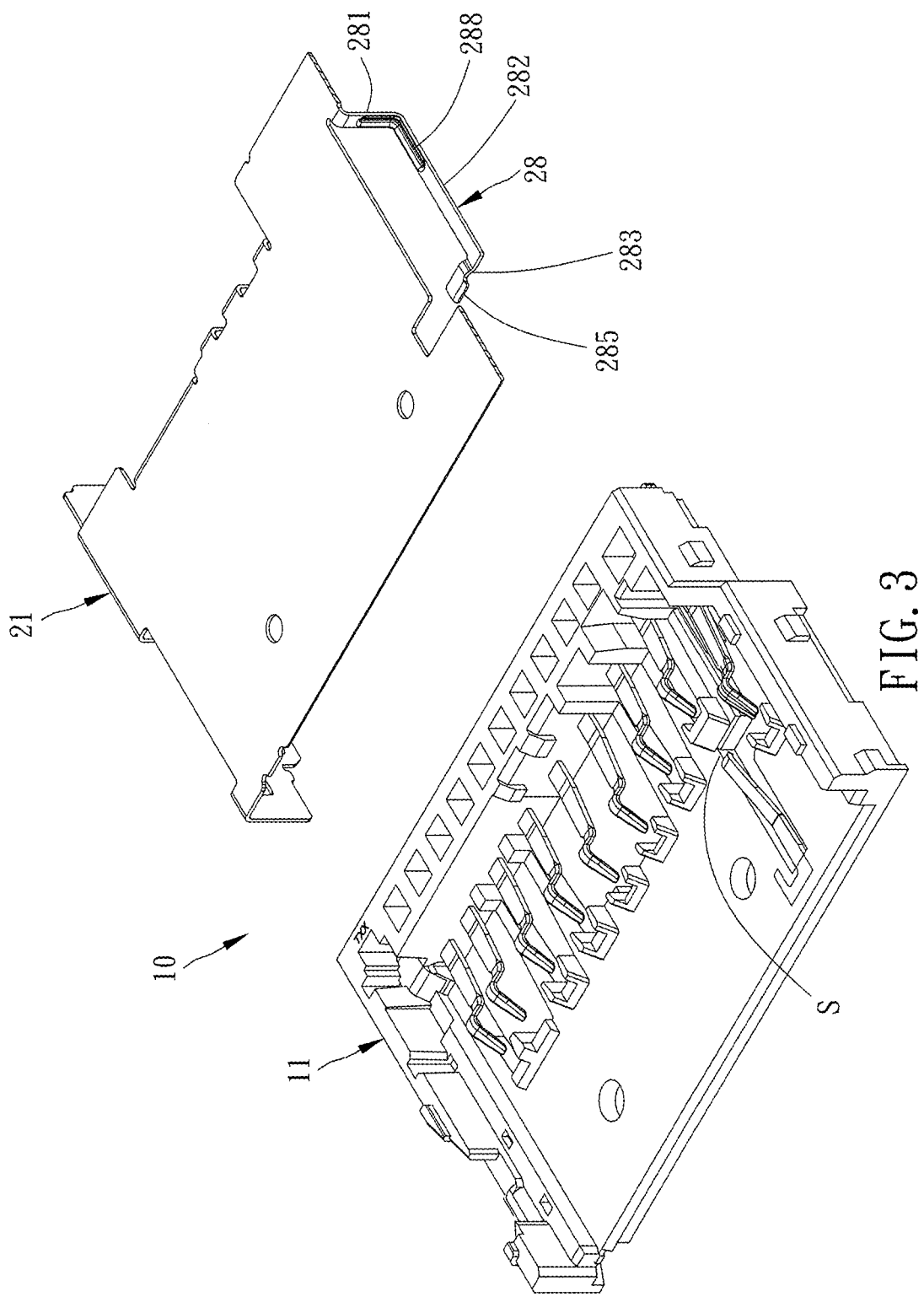
FIG. 3 is an exploded, sectional elevational view of the card connector in accordance with the present invention, illustrating the configuration of the mating conduction terminal.
Figure 4:
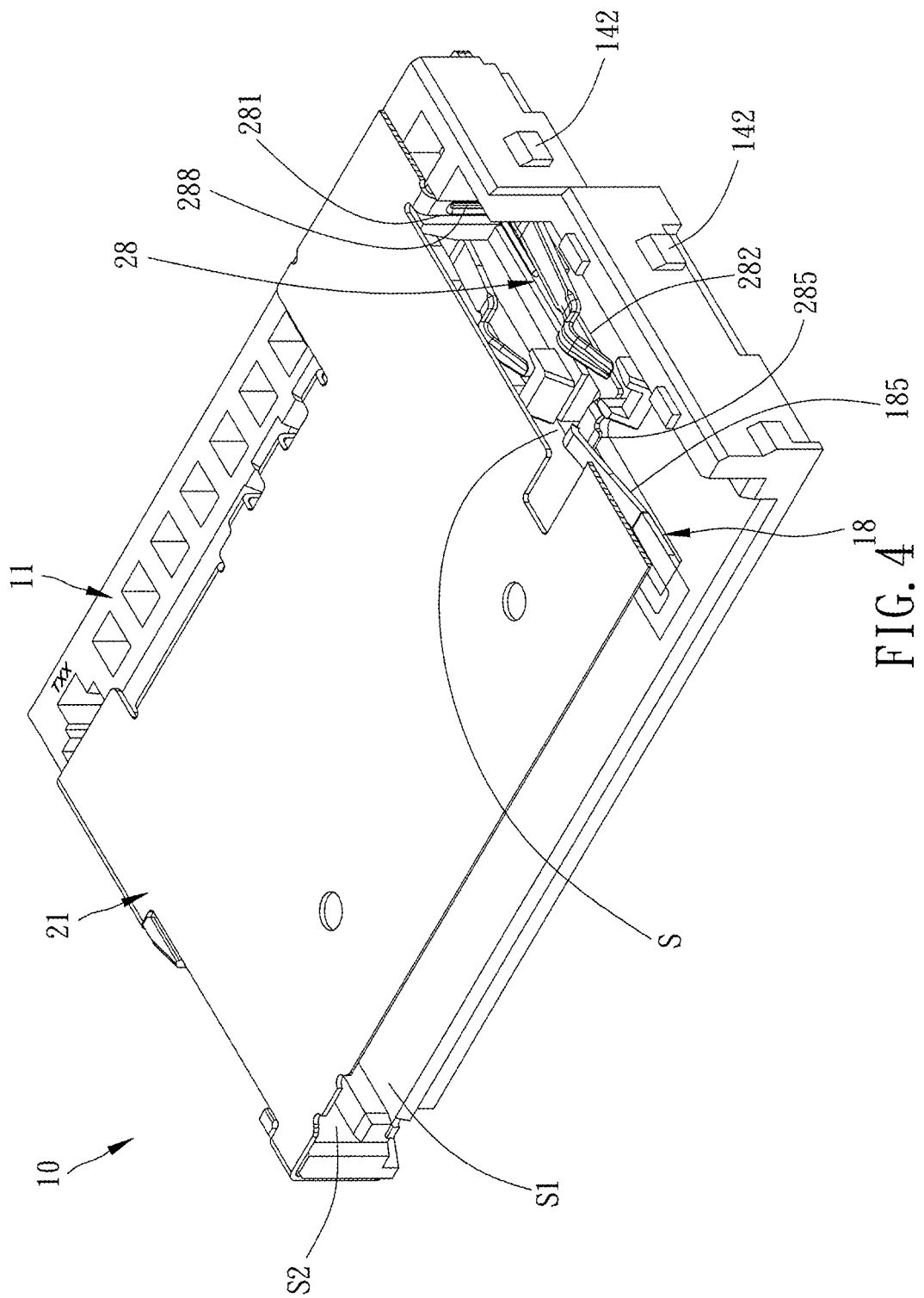
FIG. 4 is a sectional elevational view of the card connector in accordance with the present invention, illustrating the identification terminal disposed in contact with the mating conduction terminal.
Figure 5:
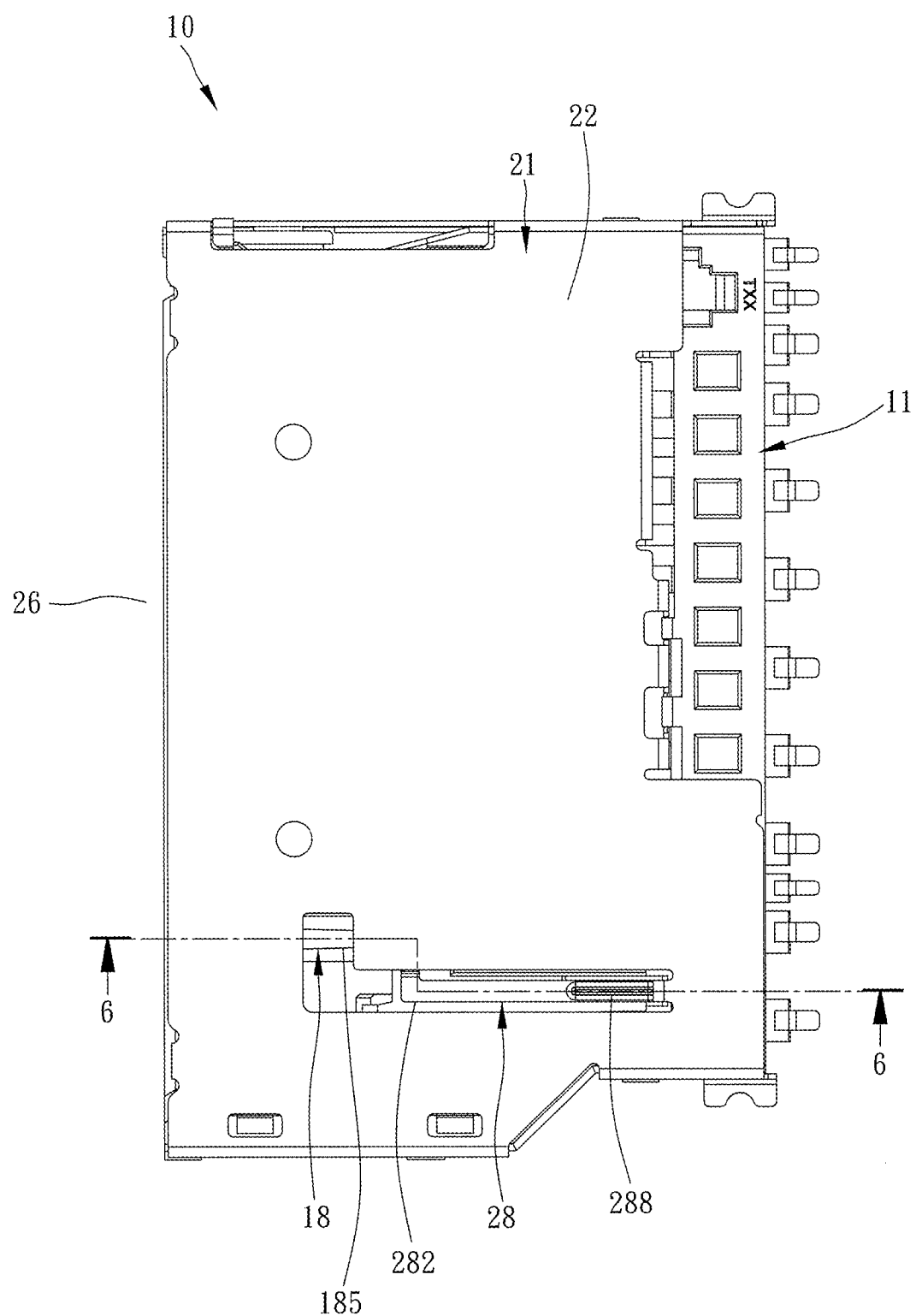
FIG. 5 is a top view of the card connector in accordance with the present invention.

Referring to FIGS. 1-6, a card connector 10 with identification function in accordance with the present invention is shown. The card connector 10 mainly comprises a base member 11, a cover member 21 and a plurality of conducting terminals 31.

The base member 11 comprises a bottom wall 12 and two sidewalls 14 respectively located at two opposite lateral sides of the bottom wall 12. By means of the concavo-convex shape of the two sidewalls 14, a first space S1 and a second space S2 are defined between the two sidewalls 14. The first space S1 is disposed below and in communication with the second space S2. In the present preferred embodiment, the width of the first space S1 is smaller than the width of the second space S2, thereby fitting the configuration of a SD card.

The cover member 21 comprises a top portion 22. The cover member 21 is covered on the base member 11, defining with the base member 11 a card slot 26 in a front side thereof. Further, the second space S2 and the first space S1 are disposed between the cover member 21 and the base member 11.

The conducting terminals 31 are mounted in the base member 11 with respective terminal ends thereof extended into the first space S1 or the second space S2.

Further, an identification terminal 18 is mounted at the bottom wall 12 of the base member 11. The identification terminal 18 comprises an actuation segment 185 upwardly backwardly extended from the bottom wall 12 of the base member 11. The actuation segment 185 projects into the first space S1 without entering the second space S2.

The cover member 21 further comprises a mating conduction terminal 28 located at the top portion 22 and made from an electrically conductive material. The mating conduction terminal 28 comprises a falling segment 281 downwardly extended from the top portion 22 of the cover member 21, a horizontal segment 282 extended from a distal end of the falling segment 281 remote from the cover member 21 with a distal end thereof suspending below the actuation segment 185 of the identification terminal 18. In this embodiment, the horizontal segment 282 of the mating conduction terminal 28 extends forwardly in horizontal. The mating conduction terminal 28 further comprises a contact end piece 285 extended sideways from the distal end of the horizontal segment 282 and suspended below the actuation segment 185 of the identification terminal 18. When the identification terminal 18 is pressed downward by an external force, the identification terminal 18 will contact the contact end piece 285, achieving electrical conductivity. In this embodiment, the mating conduction terminal 28 further comprises an ascent segment 283 connected between the contact end piece 285 and the horizontal segment 282. The contact end piece 285 is disposed higher than the horizontal segment 282, and adapted for setting and adjusting the contact distance between the identification terminal 18 and the mating conduction terminal 28. In actual application, the aforesaid contact end piece 285 can be omitted, and the body of the horizontal segment 282 is directly used for the contact of the identification terminal 18 to achieve electrical conductivity. Further, the cover member 21 is made from an electrically conductive material (such as metal), and formed with the mating conduction terminal 28 in one piece. Alternatively, the cover member 21 can be made from a non-conductive material and, the mating conduction terminal 28 is fixedly connected to the cover member 21. This alternate form is obvious to any person skilled in the art, and therefore no further explanation with illustrations will be necessary. Further, the arrangement that the horizontal segment 282 is suspended below the distal end of the identification terminal 18 prevents the inserted card from hitting against the horizontal segment 282.

Further, in actual application, a space S can be provided at a rear side of the distal end of the identification terminal 18. By means of this space S, the distal end of the identification terminal 18 is kept apart from other components at a predetermined distance. In the present preferred embodiment, the distal end of the identification terminal 18 is kept apart from an internal protruded structure of the base member 11 at a predetermined distance; the space S is provided for the contact end piece 285 to pass therethrough, whereby the cover member 21 can easily be assembled with the base member 11.

In the actual implementation, there is another technical option. The cover member 21 is configured to provide a lateral portion 24 at each of two opposite lateral sides of the top portion 22. These two lateral portions 24 are respectively fastened to the two sidewalls 14 of the base member 11. The cover member 21 further comprises a plurality of L-shaped retaining holes 242 upwardly extended from a bottom edge of each lateral portion 24 and then turned horizontally backward. The base member 11 further comprises a plurality of protruded blocks 142 located at an outer surface of each of the two sidewalls 14 thereof. These protruded blocks 142 are respectively engaged into the L-shaped retaining holes 242. When mounting the cover member 21 on the base member 11, cap the cover member 21 downwardly on the base member 11 to let the protruded blocks 142 enter the respective L-shaped retaining holes 242, and then push the cover member 21 forward relative to the base member 11 to let the protruded blocks 142 enter respective horizontal segments of the respective L-shaped retaining holes 242, and thus the cover member 21 and the base member 11 are fastened together. This assembling procedure is very convenient to perform. When capping the cover member 21 downward on the base member 11, the contact end piece 285 of the mating conduction terminal 28 is simultaneously moved through the space S; when pushing the cover member 21 forward relative to the base member 11, the contact end piece 285 is moved into the space below the identification terminal 18, achieving the effect of ease of assembly.

In the actual implementation of the mating conduction terminal 28, a rib 288 is formed on the body of the mating conduction terminal 28 and extended along the falling segment 281 to a part of the horizontal segment 282 to enhance the anti-deformation strength of the mating conduction terminal 28 and to prolong the lifespan of the mating conduction terminal 28. It is to be noted that the mating conduction terminal 28 can function well without the rib 288, i.e., the design of the rib 288 is not requisite.

The structure of the preferred embodiment of the card connector 10 in accordance with the present invention is explained above. The operation of the preferred embodiment of the card connector 10 will be outlined hereinafter.

Figure 6:
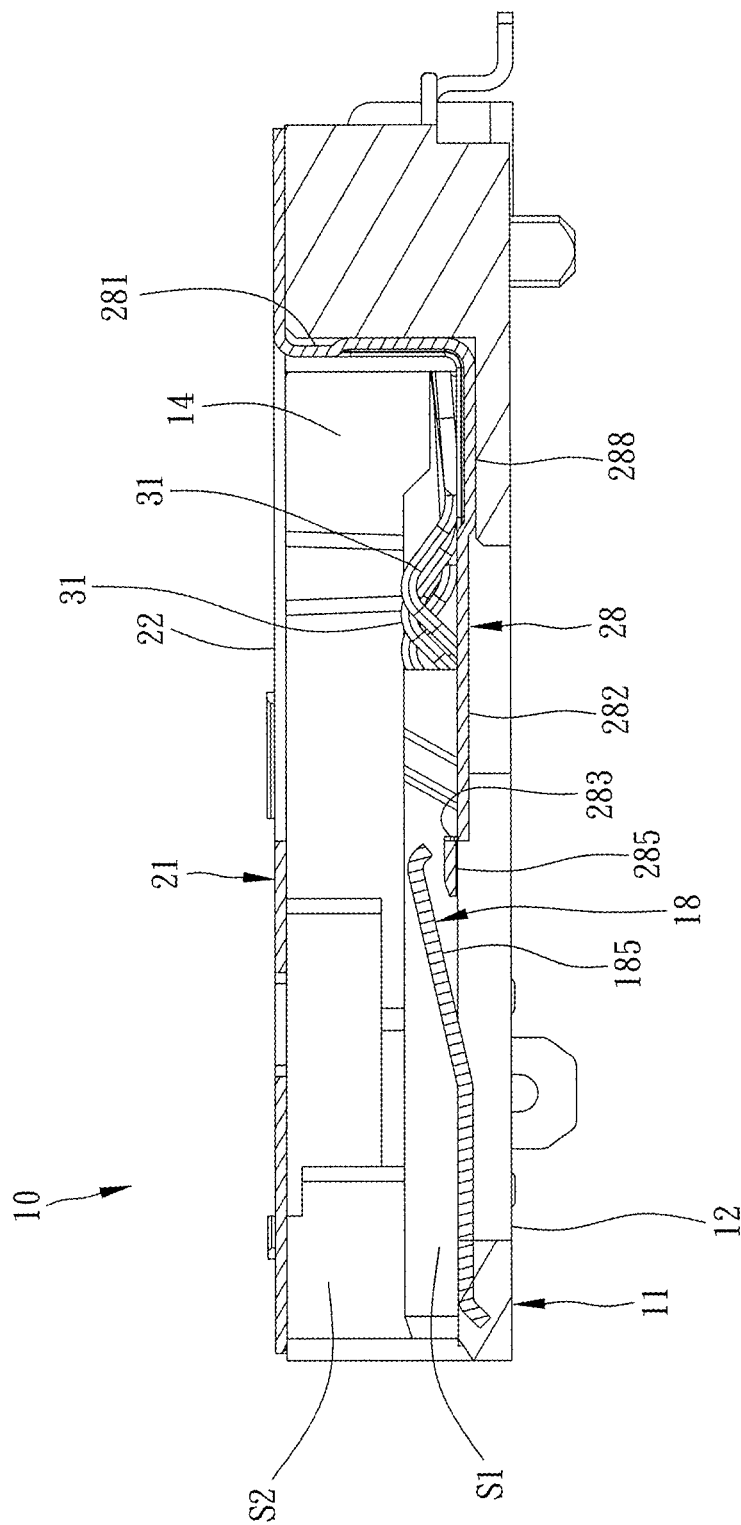
FIG. 6 is a sectional view taken along line 6-6 of FIG. 5.

Before insertion of a card, the identification terminal 18 is not pressed. At this time, the distal end of the identification terminal 18 is suspended above the elevation of the mating conduction terminal 28 without contacting the mating conduction terminal 28, as illustrated in FIG. 6. A commercial card connector generally uses a known detection technique to detect the insertion of a card. However, the known card insertion detection technique is different the card identification technique of the present invention and not within the scope of the present invention. Thus, we do not repeat this subject.

Figure 7:
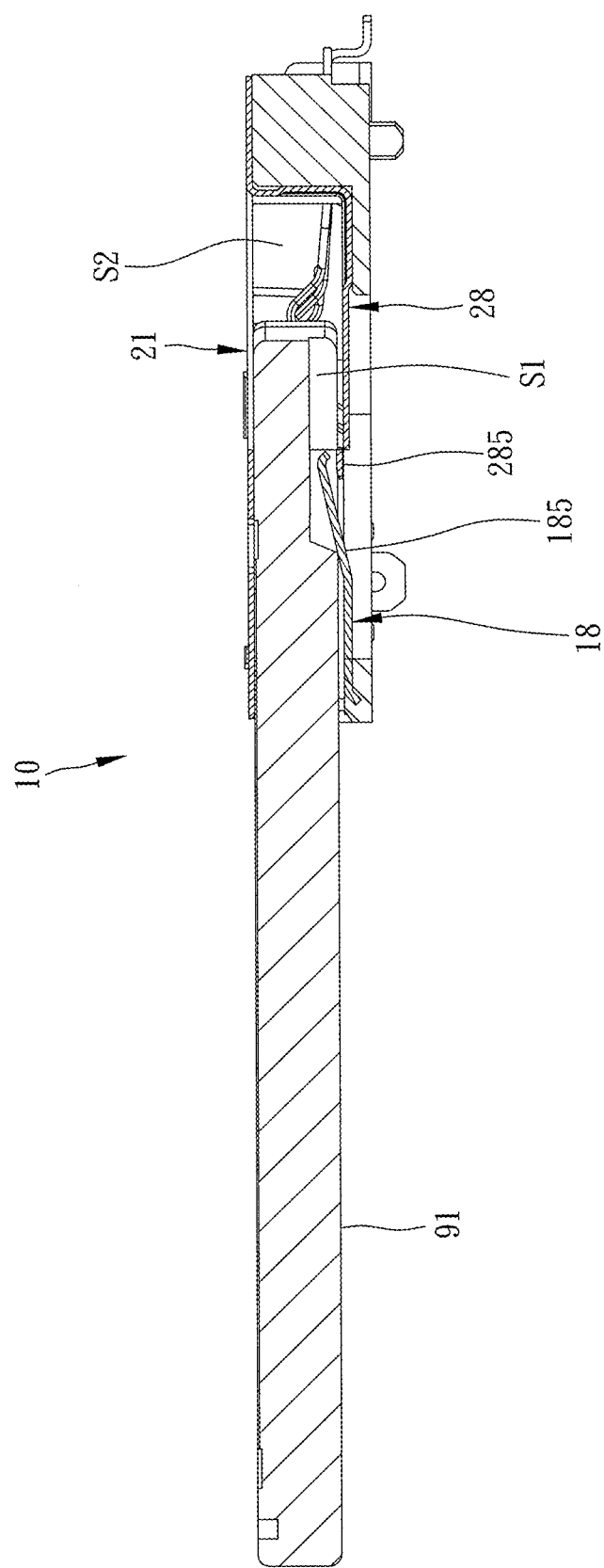
FIG. 7 is an applied view of the present invention, illustrating a SD card partially inserted into the card connector.
Figure 8:
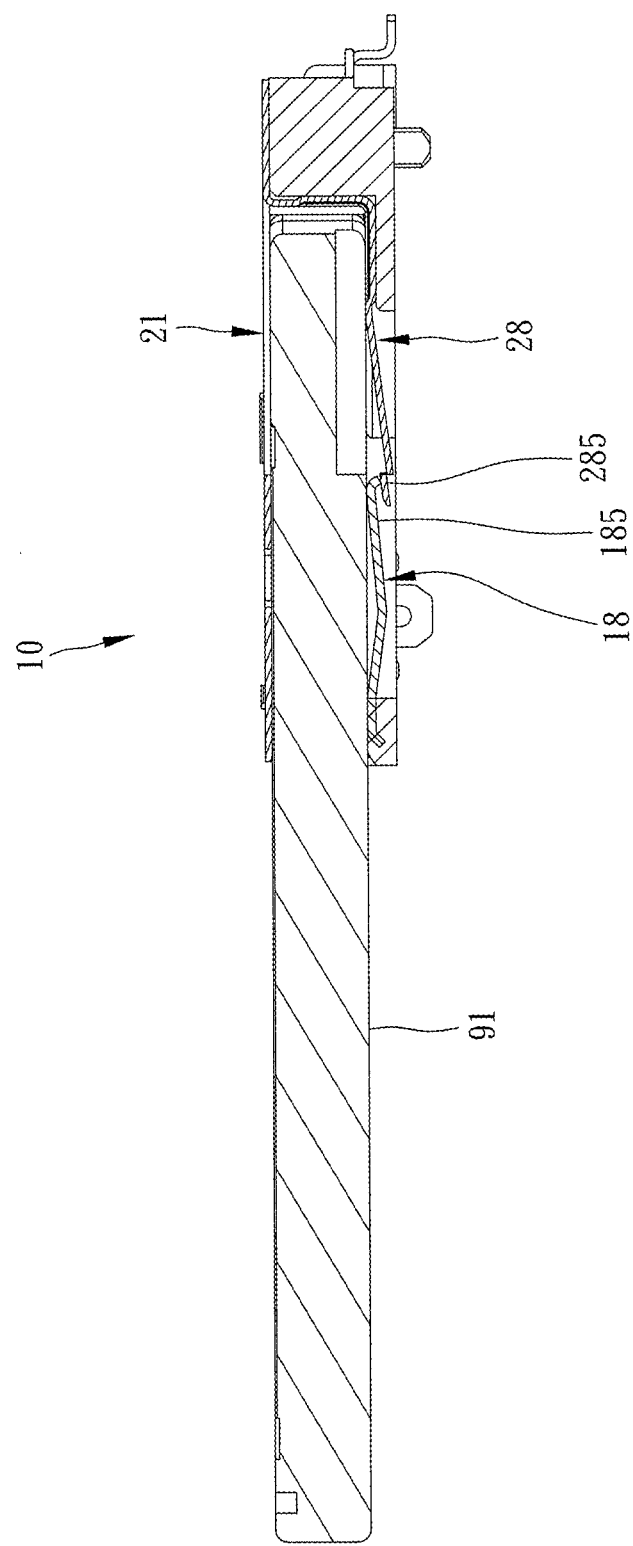
FIG. 8 corresponds to FIG. 7, illustrating the SD card inserted into position.

Referring to FIGS. 7 and 8 and FIG. 2 again, an insertion of a SD card 91 into the card slot 26 is shown. Because a SD card 91 is relatively thicker than a MMC card, and the configuration of the two opposite lateral sides of a SD card 91 fit the configuration of the two sidewalls 14, it will occupy the second space S2 and the first space S1 upon its insertion into the card slot 26. Further, because the actuation segment 185 of the identification terminal 18 is suspended in the first space S1, when the inserted SD card 91 reaches a certain depth in the card connector, as illustrated in FIG. 7, bottom edge of the inserted SD card 91 will touch the actuation segment 185. When the SD card 91 is being continuously pushed toward the inside of the card connector, as illustrated in FIG. 8, the actuation segment 185 of identification terminal 18 will be forced downwards by the bottom wall of the SD card 91 into contact with the contact end piece 285 of the mating conduction terminal 28, to achieve electrical conductivity. In this way, in matching with the conventional card insertion detection technique, the insertion of the SD card 91 is identified. Further, when the inserted SD card 91 is ejected out of the card connector, the identification terminal 18 is released from pressure and immediately returns to the previous no-contact status shown in FIG. 6.

Figure 9:
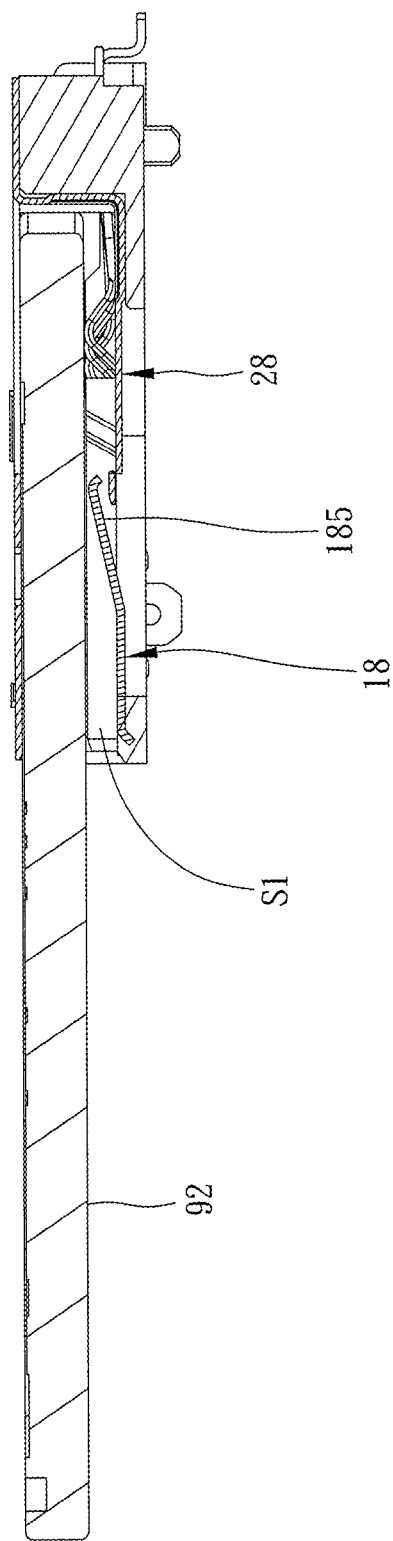
FIG. 9 is another applied view of the present invention, illustrating a MMC card inserted into the card connector in position.

Referring to FIG. 9 and FIG. 2 again, an insertion of a MMC card 92 into the card slot 26 is shown. Because a MMC card 92 is relatively thinner than a SD card, and the configuration of its two opposite lateral sides simply fitting the width of the second space S2, it will simply occupy the second space S2 upon its insertion into the card slot 26. Further, because the actuation segment 185 of the identification terminal 18 is suspended in the first space S1, the inserted MMC card 92 simply occupies the second space S2 no matter what depth of insertion is, as shown in FIG. 9. Thus, the bottom edge of the inserted MMC card 92 will not press the identification terminal 18 and, the identification terminal 18 will not be forced into contact with the mating conduction terminal 28. In this way, in matching with the conventional card insertion detection technique, the insertion of the MMC card 92 is identified. Further, when the inserted MMC card 92 is ejected out of the card connector, the identification terminal 18 still remains in no-contact status shown in FIG. 6 without contacting the mating conduction terminal 28.

On the back-end application, the identification technique of the present invention can be used to determine an inserted card to be a SD card or MMC card, and then an IC chip (not shown) is used to control whether or not to read the inserted card, for example, if the inserted card is identified to be a SD card, it is started to read the inserted card; if the inserted card is identified to be a MMC card, it will not start the reading action. This is an example of the back-end application but not intended for use to limit the scope of the claims of the present invention.

Further, the width design of the first space S1 and the second space S2 is to mate with the configurations of different cards. In the present preferred embodiment, SD card and MMC card are taken as examples for identification, therefore, the first space S1 is made relatively narrower than the second space S2. However, for the identification of other kinds of cards, the configurations of the first and second spaces shall be relatively changed. For example, when wishing to make the width of the first space S1 to be larger than the second space S2, it simply needs to change the concavo-convex shape of the two sidewalls 14 of the base member 11, maintaining the applicability of the identification technique of the present invention.

It is clear from the above description that the invention achieves the effect of identifying two different cards that have the same width but different thicknesses. Although the preferred embodiment of the present invention takes SD card and MMC card as examples for explanation, modifications and enhancements may be made for identification of cards of other specifications without departing from the spirit and scope of the invention. Accordingly, the invention is not to be limited except as by the appended claims.

What is claimed is:

1. A card connector comprising:
    a base member comprising a bottom wall, two sidewalls respectively located at two opposite lateral sides of said bottom wall, a first space defined between said two sidewalls and a second space defined between said two sidewalls and disposed above and in communication with said first space;
    a cover member comprising a top portion, said cover member being covered said on base member such that said cover member and said base member define a card slot in a front side thereof and, said first space and said second space are defined between said cover member and said base member; and
    a plurality of conducting terminals mounted in said base member;
    wherein:
    said base member further comprises an identification terminal mounted at said bottom wall, said identification terminal comprising an actuation segment upwardly backwardly extended from said bottom wall, said actuation segment projecting into said first space beyond said second space;
    said cover member further comprises a mating conduction terminal located at said top portion and made from an electrically conductive material, said mating conduction terminal comprising a falling segment downwardly extended from said top portion and a horizontal segment extended from a distal end of said falling segment remote from said top portion, said horizontal segment having a distal end thereof suspended below the elevation of a distal end of said actuation segment of said identification terminal; said identification terminal is pressable downward into contact with said mating conduction terminal upon insertion of a predetermined card into said card slot.

2. The card connector as claimed in claim 1, wherein said horizontal segment of said mating conduction terminal extends forwardly in horizontal from the distal end of said falling segment.

3. The card connector as claimed in claim 2, wherein said mating conduction terminal further comprises a contact end piece extended sideways from the distal end of said horizontal segment.

4. The card connector as claimed in claim 3, wherein said mating conduction terminal further comprises an ascent segment connected between said contact end piece and said horizontal segment to hold said contact end piece at an elevation above said horizontal segment.

5. The card connector as claimed in claim 3, wherein said base member further comprises a space defined between a part thereof and a distal end of said actuation segment of said identification terminal for the passing of said contact end piece.

6. The card connector as claimed in claim 5, wherein said cover member further comprises two lateral portions respectively located at two opposite lateral sides of said top portion, and a plurality of said L-shaped retaining holes respectively extended from a bottom edge of each said lateral portion and then turned backward at right angles; said base member further comprises a plurality of protruded blocks located at an outer surface of each said sidewall and respectively engaged into said L-shaped retaining holes.

7. The card connector as claimed in claim 1, wherein said cover member further comprises two lateral portions respectively located at two opposite lateral sides of said top portion, and a plurality of said L-shaped retaining holes respectively extended from a bottom edge of each said lateral portion and then turned backward at right angles; said base member further comprises a plurality of protruded blocks located at an outer surface of each said sidewall and respectively engaged into said L-shaped retaining holes.

8. The card connector as claimed in claim 1, wherein said cover member is made from an electrically conductive material; said mating conduction terminal and said cover member are integrated into one piece.

9. The card connector as claimed in claim 1, wherein said mating conduction terminal further comprises a rib extended along said falling segment to a part of said horizontal segment.

10. The card connector as claimed in claim 1, wherein said horizontal segment of said mating conduction terminal is disposed below the elevation of the distal end of said identification terminal.

* * * * *